(12) United States Patent
Yoshikawa et al.

(10) Patent No.: US 7,513,265 B2
(45) Date of Patent: Apr. 7, 2009

(54) HIGH PRESSURE PROCESSING METHOD AND APPARATUS

(75) Inventors: Tetsuya Yoshikawa, Takasago (JP); Yoichi Inoue, Takasago (JP); Katsumi Watanabe, Takasago (JP); Kaoru Masuda, Kobe (JP); Katsuyuki Iijima, Kobe (JP); Tomomi Iwata, Kyoto (JP); Yusuke Muraoka, Kyoto (JP); Kimitsugu Saito, Kyoto (JP); Ikuo Mizobata, Kyoto (JP)

(73) Assignees: Kabushiki Kaisha Kobe Seiko Sho, Kobe-shi (JP); Dainippon Screen Mfg. Co., Ltd., Kyoto-shi (JP)

( * ) Notice: Subject to any disclaimer, the term of this patent is extended or adjusted under 35 U.S.C. 154(b) by 721 days.

(21) Appl. No.: 10/688,889

(22) Filed: Oct. 21, 2003

(65) Prior Publication Data
US 2004/0123484 A1 Jul. 1, 2004

(30) Foreign Application Priority Data
Oct. 22, 2002 (JP) .............................. 2002-307349

(51) Int. Cl.
*B08B 6/00* (2006.01)
(52) U.S. Cl. ...................... 134/200; 134/33; 134/1.3; 118/52
(58) Field of Classification Search ................. 134/902, 134/200
See application file for complete search history.

(56) References Cited

U.S. PATENT DOCUMENTS

| 4,994,301 | A | * | 2/1991 | Kusumoto et al. | 427/586 |
| 6,334,983 | B1 | * | 1/2002 | Okayama et al. | 422/186.29 |
| 6,460,554 | B2 | | 10/2002 | Florez | |
| 6,508,197 | B1 | * | 1/2003 | Omstead et al. | 118/715 |
| 6,647,993 | B2 | * | 11/2003 | Shang et al. | 134/1.1 |
| 2002/0137334 | A1 | * | 9/2002 | Watanabe et al. | 438/677 |
| 2003/0024826 | A1 | * | 2/2003 | Yahalom et al. | 205/668 |
| 2003/0049939 | A1 | * | 3/2003 | Worm et al. | 438/745 |
| 2004/0020520 | A1 | * | 2/2004 | Kim et al. | 134/95.2 |

FOREIGN PATENT DOCUMENTS

| JP | 60191281 A | * | 8/1985 |
| JP | 63073626 | * | 9/1986 |
| JP | 63-073626 | | 4/1988 |
| JP | 10-332275 | | 12/1998 |
| JP | 11-087306 | | 3/1999 |
| JP | 2001-324263 | | 11/2001 |

* cited by examiner

*Primary Examiner*—Michael Barr
*Assistant Examiner*—Jason P Riggleman
(74) *Attorney, Agent, or Firm*—Oblon, Spivak, McClelland, Maier & Neustadt, P.C.

(57) ABSTRACT

Disclosed is a high pressure processing method for subjecting a processing object to a high pressure processing using a high pressure fluid. In this method, the high pressure fluid is brought into collision with the surface of the processing object placed in a high pressure processing chamber, and then distributed along the surface of the processing object in an outward direction beyond the processing object.

7 Claims, 5 Drawing Sheets

HIGH PRESSURE PROCESSING METHOD AND APPARATUS

BACKGROUND OF THE INVENTION

The present invention relates to a high pressure processing method and apparatus applicable to a development, cleaning, etch, rinse, displacement or drying process for a sample or processing object, such as semiconductor wafers or liquid-crystal substrates, having a super-microstructure.

As well known, in the field of semiconductor chip design, structural minimization is being carried out with great speed. While the wire size in a chip was about 1 μm decade ago, it is currently reduced down to about 0.18 μm. Further, a device with a wire size of 0.13 μm is close to practical use, and various technical developments have already started with a specific goal of 0.10 to 0.07 μm or stretched to 0.05 μm.

On the other hand, such progressive structural minimization involves some new technical problems which are unsolvable with conventional techniques. By way of example, one of currently concerned major technical problems is the collapse or breakdown of the microstructure due to capillary force. Specifically, most of semiconductor chips are produced by subjecting a silicon wafer to a number of wet processing, that is, processing using liquid. For example, in a photoresist development process, a liquid developer or alkaline aqueous solution is rinsed using pure water, and then dried. In the drying process, the wafer soaked with the water is exposed to the interface between liquid (pure water) and gas, and a high surface tension generated in the interface acts on adjacent wall-like developed photoresist layers, which stand on the silicon wafer substrate in parallel with each other, to pull them close to each other. Finally, the surface tension leads to the collapse phenomenon of the photoresist layers.

Such a phenomenon also occurs in manufacturing of electromechanical devices, so-called MEMS (Micro Electro Mechanical System), having a low-rigidity structure such as a micro-cantilever structure. In a typical production process of this type of devices, after removing a sacrifice layer on a substrate by an etch process using a hydrofluoric acid solution or the like, the substrate with cantilever structures is rinsed out using rinse liquid, and then dried. In this case, it is also known that a capillary force arising during evaporation of the rinse liquid causes undesirable sticking between the cantilever structures or between the cantilever structure and the substrate.

Among various techniques developed for solving the above problem, a drying technique using a high pressure fluid, particularly so-called "supercritical fluid", is recently regarded as one of noteworthy technologies. This drying technique using the supercritical fluid allows a microstructure to be dried without formation of any gas-liquid interface or under the condition that the action of capillary force is effectively suppressed. Typically, carbon dioxide is used as the supercritical fluid, because it is excellent in handleability by virtue of the fact that it has a critical temperature of 31° C. and a critical pressure of 7.3 MPa, and is a noncombustible, non-poisonous and inexpensive substance.

In this connection, it is recently reported that the pressure of carbon dioxide serving as the supercritical fluid is preferably 7.4 MPa.

In addition to the use in a drying process, the potential of applying supercritical carbon dioxide to a cleaning process for semiconductor wafers or the like draws high attention of researchers. While a wet processing is used in a conventional cleaning process, a serious problem has been turning up in connection with introduction of the structural minimization in the level of 0.1 μm or less, and new materials. That is, the conventional cleaning technique using liquid hardly allows the liquid to be fed into a microstructure, and thus an intended cleaning effect cannot be adequately obtained. Particularly in a new-generation insulation film having a porous structure for providing a lower dielectric constant thereto, a liquid introduced in micropores during a wet processing cannot be fully removed therefrom, and the remaining liquid would have a serious adverse effect on characteristics of a device to be obtained. In contrast, a cleaning process using supercritical carbon dioxide (supercritical fluid) having an excellent permeability close to that of gas allows the supercritical carbon dioxide to be readily infiltrated into a microstructure, without any problem of residual liquid in the microstructure as in the wet processing (see, for example, Japanese Patent Laid-Open Publication H09-232266).

SUMMARY OF THE INVENTION

In view of the above circumstances concerning a method and apparatus for subjecting a sample or processing object with a super-microstructure, such as semiconductor wafers or liquid-crystal substrates, to a given processing, it is therefore an object of the present invention to provide an improved method and apparatus capable of processing a processing object by use of a high pressure fluid, such as a supercritical fluid having various excellent properties as described above, and fulfilling the demand of enhanced efficiency and/or uniformity in processing.

In order to achieve this object, the present invention provides a high pressure processing method for subjecting a processing object to a high pressure processing using a high pressure fluid. In this method, the high pressure fluid is brought into collision with the surface of the processing object placed in a high pressure processing chamber, and then distributed along the surface of the processing object in an outward direction beyond the processing object.

The present invention also provides a high pressure processing apparatus for supplying a high pressure fluid to a processing object to apply a high pressure processing to the processing object. The high pressure processing apparatus comprises a high pressure container adapted to receive the processing object therein, a fluid supplier for supplying the high pressure fluid toward the surface of the processing object in the high pressure container, and a fluid discharger for allowing the high pressure fluid supplied from the fluid supplier to the surface of the processing object, to be distributed outward along the surface of the processing object, and discharged outside the high pressure container.

These and other objects, features, aspects, and advantages of the present invention will become more apparent from the following detailed description of the preferred embodiments/examples with reference to the accompanying drawings.

DESCRIPTION OF THE PREFERRED EMBODIMENT

Figure 1:
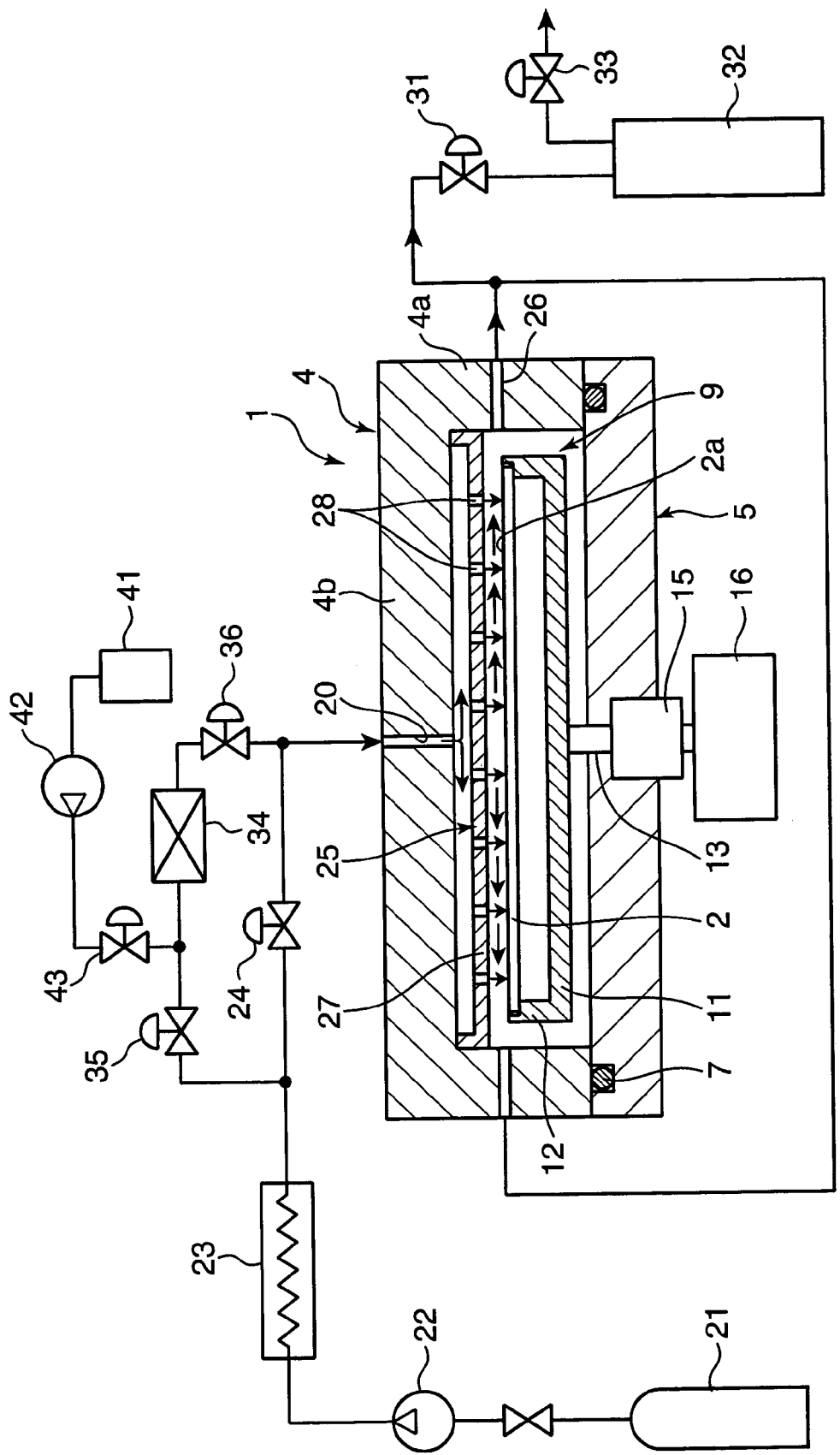
FIG. 1 is a sectional view of a high pressure processing apparatus according to an embodiment of the present invention.

With reference to the drawings, a high pressure processing method and a high pressure processing apparatus according to a preferred embodiment of the present invention will now be described in conjunction with specific embodiments by way of illustration. Referring to FIG. 1 showing a high pressure processing apparatus according to one embodiment of the present invention, the reference numeral 1 indicates a high pressure container. The high pressure container 1 comprises a cylindrical upper body 4 integrally having a sidewall 4a and a top wall 4b, and a lower body 5 defining the bottom wall of the high pressure container 1. The upper body 4 and the lower body 5 are adapted to be held in close contact with one another through a seal member 7, and to be separated from one another, as required, so as to relatively move them vertically. That is, the high pressure container 1 is designed such that it is selectively opened and closed, and the inner space thereof to be formed when closed is used as a high pressure processing chamber 9 for receiving therein a wafer 2 serving as a processing object, such a semiconductor wafer or a liquid-crystal substrate (the term "wafer" herein collectively means these wafers). In the illustrated embodiment, the wafer 2 has a circular-disc or rounding-board shape.

The high pressure processing chamber 9 contains a mounting table 11 for placing the wafer 2 thereon. The mounting table 11 is provided with a ring-shaped support pawl 12 protruding upward from the periphery thereof, and a support shaft 13 protruding downward from the center thereof. The wafer 2 is placed on the mounting table 11 in such a manner that the periphery of the wafer 2 is fitted in the support pawl 12 to allow the surface 2a of the wafer 2 to be kept horizontal while facing upward.

The support shaft 13 of the mounting table 11 extends to penetrate the lower body 5 of the high pressure container 1 through a high pressure-sealed rotation transfer mechanism 15. The high pressure-sealed rotation transfer mechanism 15 has a rotational shaft connected to a rotating mechanism 16 outside the high pressure container 1. The rotating mechanism 16 is operable to rotate the wafer 2 about the support shaft 13 at any selected rotational speed, together with the mounting table 11. In this embodiment, a combination of the mounting table 11, the support shaft 13, the high pressure-sealed rotation transfer mechanism 15 and the rotating mechanism 16 serves as rotating device for rotating the wafer 2 or processing object.

The top wall 4b of the upper body 4 of the high pressure container 1 is formed with a fluid introduction passage 20. A flow path on the upstream side of the fluid introduction passage is provided with a cylinder 21, a pump 22, a heater 23 and a high pressure valve 24, in this order. The cylinder 21 contains liquid carbon dioxide. The liquid carbon dioxide stored in the cylinder 21 is pressurized by the pump 22 and heated by the heater 23 so as to create supercritical carbon dioxide (hereinafter referred to as "supercritical fluid" excepting if needed) serving as a high pressure fluid. The created supercritical fluid is sequentially introduced to the high pressure processing chamber 9 through the fluid introduction passage 20.

A fluid dispersion mechanism 25 is provided on the downstream side of the outlet of the fluid introduction passage 20 open to the high pressure processing chamber 9. The fluid dispersion mechanism 25 comprises a circular-disc-shaped closure plate 27 fitted to the inner surface of the high pressure container 1, and a plurality of through holes 28 penetrating the closure plate 27 vertically. When the supercritical fluid introduced in the high pressure processing chamber 9 passes through the fluid dispersion mechanism 25, the fluid dispersion mechanism 25 allows the supercritical fluid to be supplied evenly and approximately perpendicularly to the surface 2a of the wafer 2. In this embodiment, a combination of the fluid introduction passage 20, the flow path on the upstream side thereof, the components interposed in the upstream flow path, i.e. the cylinder 21, the pump 22, the heater 23 and the high pressure valve 24, and the fluid dispersion mechanism 25 serves as a fluid supplier for supplying the supercritical fluid or high pressure fluid to the surface 2a of the wafer 2 contained in the high pressure processing chamber 9.

The high pressure container 1 provided with a temperature-regulator (not shown) for control the high pressure processing chamber 9 at a predetermined temperature. The high pressure container 1 is also provided with a pressure gauge (not shown) for detecting the pressure of the high pressure processing chamber 9 to be defined when the high pressure container 1 is closed.

The sidewall 4a of the upper body 4 of the high pressure container 1 is formed with a plurality of fluid discharge passages 26. The fluid discharge passages 26 are arranged in a radial pattern around the high pressure container 1. Thus, the supercritical fluid introduced in the high pressure processing chamber 9 from the fluid introduction passage 20 is supplied evenly and perpendicularly to the surface 2a of the wafer 2 through the fluid dispersion mechanism 25. After the collision with the surface 2a of the wafer 2, the supercritical fluid is distributed along the surface 2a of the wafer 2 toward the periphery of the wafer 2, and further distributed outward from the periphery of the wafer 2. Then, the supercritical fluid is discharged outside the high pressure container 1 through the fluid discharge passage 26.

The supercritical fluid discharged from the high pressure processing chamber 9 is depressurized through a pressure-regulating valve 31, and discharged from a high pressure valve 33 through a separation tank 32. In this embodiment, a combination of the fluid discharge passage 26, the flow path on the downstream side thereof, and the components interposed in the downstream flow path, i.e. the pressure-regulating valve 31, the separation tank 32 and the high pressure valve 33 serves as a fluid discharger for discharging the supercritical fluid or high pressure fluid used for applying the high pressure processing to the wafer 2, from the high pressure processing chamber 9.

While the embodiment illustrated in FIG. 1 is constructed to releases the supercritical carbon dioxide from the high pressure valve 33 to atmosphere, the supercritical carbon dioxide from the high pressure valve 33 may be re-liquefied through an appropriate device, and recycled to the cylinder 21.

Further, depending on intended purposes of the high pressure processing, the supercritical fluid (supercritical carbon dioxide in this embodiment) as a principal component for the high pressure processing is added with a cleaning agent or a co-solvent, in some case. Thus, the high pressure processing apparatus illustrated in FIG. 1 additionally includes a flow bypass which is branched from the flow path between the heater 23 and the high pressure valve 24, and combined with the flow path between the high pressure valve 24 and the fluid introduction passage 20 while bypassing the high pressure valve 24.

This flow bypass is provided with a high pressure valve 35, a mixer 34 and another high pressure valve 36 which are interposed therein. The high pressure processing apparatus also includes a branch path which is branched from the flow bypass between the high pressure valve 35 and the mixer 34 to provide fluid communication with a tank 41 storing chemical liquid. The branch path is provided with a high pressure valve 43 and a pump 42 which are interposed therein.

In an operation of adding the chemical liquid to the supercritical fluid, the high pressure valve 24 is closed, and the respective high pressure valves 35, 36, 43 are opened. Then, the chemical liquid stored in the tank 41 is injected into the flow of the supercritical fluid through the high pressure valve 43 while being pressurized by the pump 42. After the injection, the supercritical fluid and the injected chemical liquid is evenly mixed together by the mixer 34, and the supercritical fluid with the blended chemical liquid will be introduced into the high pressure processing chamber 9 through the fluid introduction passage 20.

According to the above high pressure processing apparatus, the supercritical fluid introduced in the high pressure processing chamber 9 is brought into collision with the surface 2a of the wafer 2 in a direction perpendicular to the surface 2a to generate turbulences in the flow of the supercritical fluid on the surface 2a of the wafer 2 so as to allow cleaning liquid or the like in the wafer 2 to be quickly displaced. In cleaning or drying process, flesh supercritical fluid can be continuously supplied to allow such a processing to be performed efficiently.

After the processing, the supercritical fluid including impurities from the contact with the surface 2a of the wafer 2 can be distributed outward and discharged from the high pressure processing chamber 9 through the fluid discharge passage 26, to prevent the supercritical fluid from turning around toward the back surface of the wafer 2 to contaminate the back surface. In addition, processing uniformity in the plane of the wafer 2 can be improved by rotation of the wafer 2 and thereby further improved efficiency in cleaning or drying. For the purpose of providing improved in-plane uniformity, the rotational speed of the wafer 2 can be set at about 100 rpm to obtain a sufficient result. For the purpose of providing improved processing efficiency, the rotational speed of the wafer 2 is preferably set in the range of about 300 to 1000 rpm.

As an example, a drying process of an insulative film using the inventive apparatus will be described below.

After a wet cleaning, a spin-dried wafer 2 is placed on the mounting table 11 in the high pressure container 1, and the high pressure container 1 is closed. Then, the high pressure valves 35, 36 and the pressure-regulating valve 31 are closed, and the high pressure valve 24 is opened. In this state, the pump 22 is activated. Upon the activation of the pump 22, the liquid carbon dioxide stored in the cylinder 21 is changed into a supercritical state through the pressurization by the pump 22 and the heating by the heater 23, and the supercritical fluid is introduced into the high pressure processing chamber 9 through the fluid introduction passage 20. Then, the temperature of the high pressure processing chamber 9 is maintained at 80° C., and the pressure of the high pressure processing chamber 9 is controlled to increase up to 12 MPa while monitoring the pressure of the high pressure processing chamber 9 using the pressure gauge (not shown).

When the pressure of the high pressure processing chamber 9 gets up to 12 MPa, the pressure-regulating valve 31 is opened. The opening of the pressure-regulating valve 31 is adjusted such that the amount of the carbon dioxide supplied from the pump 22 is to be approximately equal to the amount of the carbon dioxide discharged through the pressure-regulating valve 31. Thus, the supercritical fluid is distributed in the high pressure processing chamber 9 under the condition that the pressure of the high pressure processing chamber 9 is maintained at an approximately constant value. In this process, the rotating mechanism 16 is activated to rotate the wafer 2 at 100 rpm for 10 minutes.

In the above operation, the supercritical fluid introduced through the fluid-induction passage 20 can be brought into collision with the surface 2a of the wafer 2 in an evenly dispersed state in a direction perpendicular to the surface 2a, and distributed along the surface 2a of the wafer 2 while generating turbulences on the surface 2a of the wafer 2 to allow cleaning liquid in the wafer 2 to be quickly displaced therewith. Thus, the supercritical fluid is distributed radially outward along the surface 2a of the wafer 2 while efficiently incorporating therein moisture remaining in the microstructure of the wafer 2. In this case, since the insulative film subject to drying is a thin film having the thickness of several μm or less, the processing time for drying the insulative thin film can be significantly reduced by generating turbulences in the supercritical fluid to perform efficient displacement on the surface 2a of the wafer 2 in the above way. The supercritical fluid with the moisture incorporated therein will be discharged outside the high pressure processing chamber 9 through the fluid discharge passage 26 provided in the side portion of the high pressure container 1.

After 10 minutes, the pump 22 is stopped, and the high pressure valve 24 is closed. Thus, the supercritical fluid remaining in the high pressure processing chamber 9 is discharged outside the high pressure processing chamber 9 through the pressure-regulating valve 31, and after the lapse of a given time, the pressure of the high pressure processing chamber 9 is returned to the atmospheric pressure. After returning to the atmospheric pressure, the high pressure container 1 is opened, and the wafer 2 is taken out of the high pressure container 1 to complete the drying. After the drying, the residual moisture in the wafer 2 taken out of the high pressure container 1 was actually measured by FTIR (Fourier transform infrared spectrometer). As a result, the measured moisture was less than a given lower limit.

As another example, a wafer cleaning using the inventive apparatus will be described below.

A wafer 2 after etching and ashing is placed on the mounting table 11 in the high pressure container 1, and the high pressure container 1 is closed. After the high pressure valves 35, 36 and the pressure-regulating valve 31 are closed, the high pressure valve 24 is opened, and the pump 22 is activated. Upon the activation of the pump 22, the liquid carbon dioxide stored in the cylinder 21 is changed into a supercritical state through the pressurization by the pump 22 and the heating by the heater 23, and the supercritical fluid is introduced into the high pressure processing chamber 9 through the fluid introduction passage 20. Then, the temperature of the high pressure processing chamber 9 is maintained at 45° C., and the pressure of the high pressure processing chamber 9 is controlled to increase up to 14 MPa while monitoring the pressure of the high pressure processing chamber 9 using the pressure gauge.

When the pressure of the high pressure processing chamber 9 gets up to 14 MPa, the pressure-regulating valve 24 is closed, and the high pressure valves 35, 36, 43 and the pressure-regulating valve 31 are opened. Further, the pump 42 is activated. The opening of the pressure-regulating valve 31 is adjusted such that the amount of the carbon dioxide supplied from the pump 22 is to be approximately equal to the amount of the carbon dioxide discharged through the pressure-regulating valve 31. Thus, the chemical liquid, such as a cleaning agent, stored in the tank 41 is pressurized by the pump 42, and injected into the flow of the supercritical fluid. The injected chemical liquid and the supercritical fluid are evenly mixed together by the mixer 34, and introduced into the high pressure processing chamber 9 through the fluid introduction passage 20. Then, the supercritical fluid with the blended chemical liquid is distributed in the high pressure processing chamber 9 under the condition that the pressure of the high pressure processing chamber 9 is maintained at an approximately constant value. In this process, the rotating mechanism 16 is activated to rotate the wafer 2 at 100 rpm for 10 minutes.

In the above operation, the supercritical fluid with the blended chemical liquid introduced through the fluid-induction passage 20 can be brought into collision with the surface 2a of the wafer 2 in an evenly dispersed state in a direction perpendicular to the surface 2a, and distributed along the surface 2a of the wafer 2 while generating turbulences on the surface 2a of the wafer 2 to allow processing liquid in the wafer 2 to be quickly displaced therewith. Thus, the supercritical fluid is rapidly distributed outwardly or toward the periphery of the wafer 2 along the surface 2a of the wafer 2 while allowing the reaction between the chemical liquid in the supercritical fluid and residual resist layers or polymer in the wafer 2. In this manner, the processing time for cleaning can be significantly reduced by generating turbulences in the supercritical fluid to perform efficient displacement of the supercritical fluid on the surface 2a of the wafer 2. The supercritical fluid with the cleaned substances incorporated therein will be discharged outside the high pressure processing chamber 9 through the fluid discharge passage 26 provided in the side portion of the high pressure container 1.

After 10 minutes, the high pressure valves 35, 36 and 43 are closed, and the high pressure valve 24 is opened. Then, the pump 42 is stopped. Thus, the supercritical fluid containing no chemical liquid is distributed in the same path to rinse the surface 2a of the wafer 2.

After the rinse process continues for 10 minutes, the pump 22 is stopped, and the high pressure valve 24 is closed. Thus, the supercritical fluid remaining in the high pressure processing chamber 9 is discharged outside the high pressure processing chamber 9 through the pressure-regulating valve 31, and after the lapse of a given time, the pressure of the high pressure processing chamber 9 is returned to the atmospheric pressure. After returning to the atmospheric pressure, the high pressure container 1 is opened, and the wafer 2 is taken out of the high pressure container 1 to complete the cleaning.

While the rinse process in the above example is performed once, a first rinse process using a first chemical liquid may be added between a cleaning process using a second chemical liquid and a second rinse process using supercritical carbon dioxide containing no chemical liquid, as needed. Further, another process using a third chemical liquid may be added. Such an additional process is appropriately selected in accordance with the property of a processing object to be cleaned.

Figure 2:
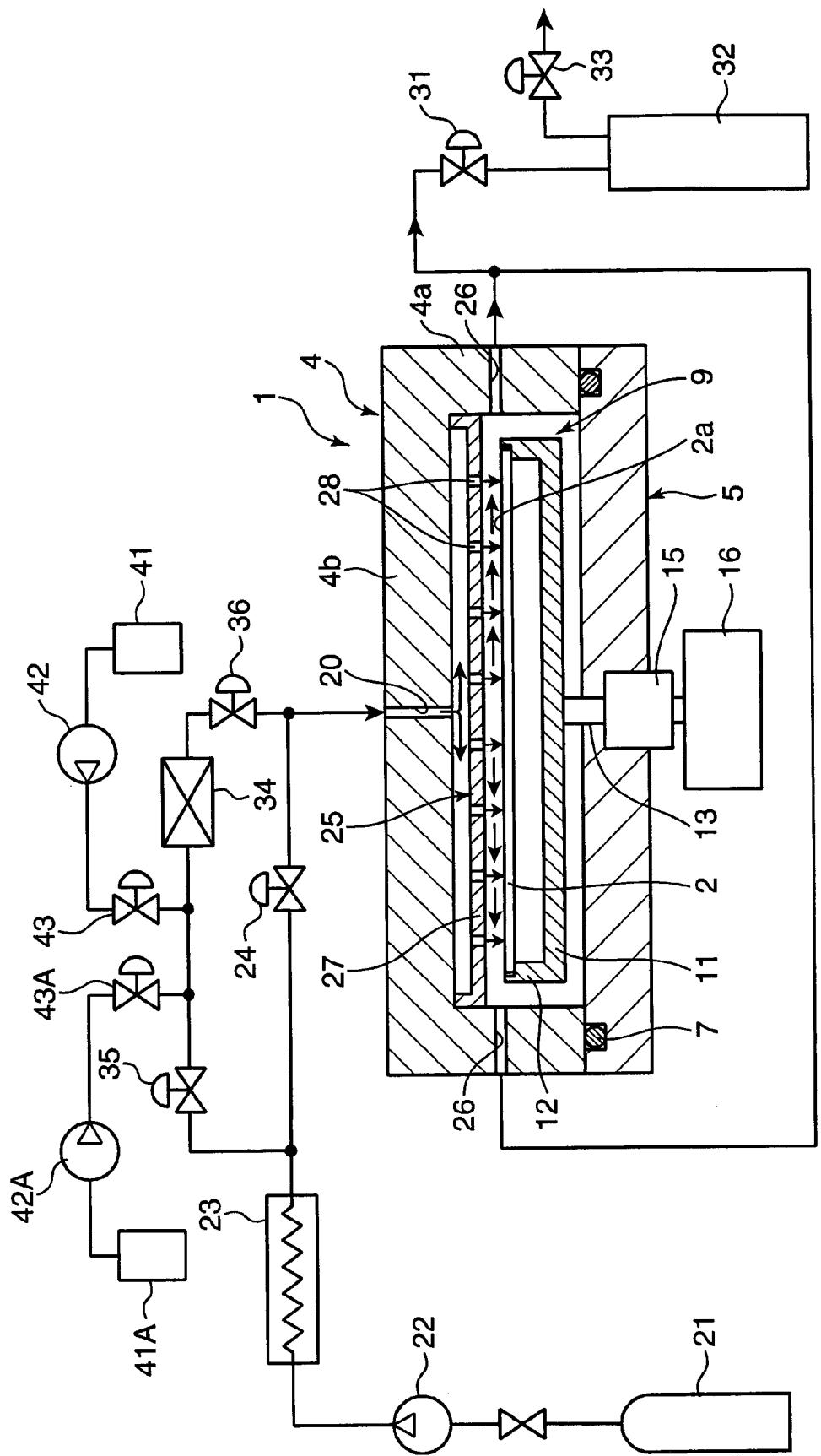
FIG. 2 is a sectional view of a high pressure processing apparatus according to another embodiment of the present invention.

FIG. 2 shows a high pressure processing apparatus according to another embodiment of the present invention.

The illustrated high pressure processing apparatus includes two branch paths which are branched from a flow bypass between a high pressure valve 35 and a mixer 34 to provide fluid communication with a tank 41 and a tank 41A, respectively. One of the branch paths is provided with a high pressure valve 43 and a pump 42 which are interposed therein. The other branch path is provided with a high pressure valve 43A and a pump 42A which are interposed therein.

According to this embodiment, for example, a first chemical liquid is stored in the tank 41 in one of the branch paths, and a second chemical liquid is stored in the tank 41A in the other branch path. Then, the high pressure valves 43, 43A can be controllably opened and closed to switch the first and second chemical liquids appropriately, so as to achieve two types of rinse processing (first and second rinse processes) using two type of different chemical liquids.

Figure 3:
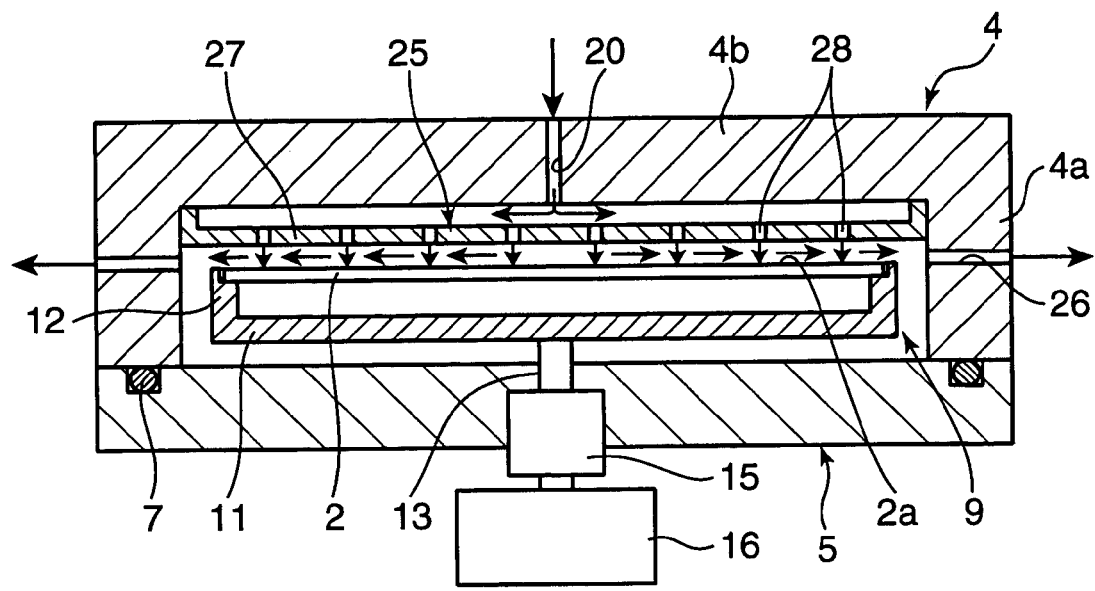
FIG. 3 is a sectional view of a high pressure processing apparatus according to another embodiment of the present invention.
Figure 4:
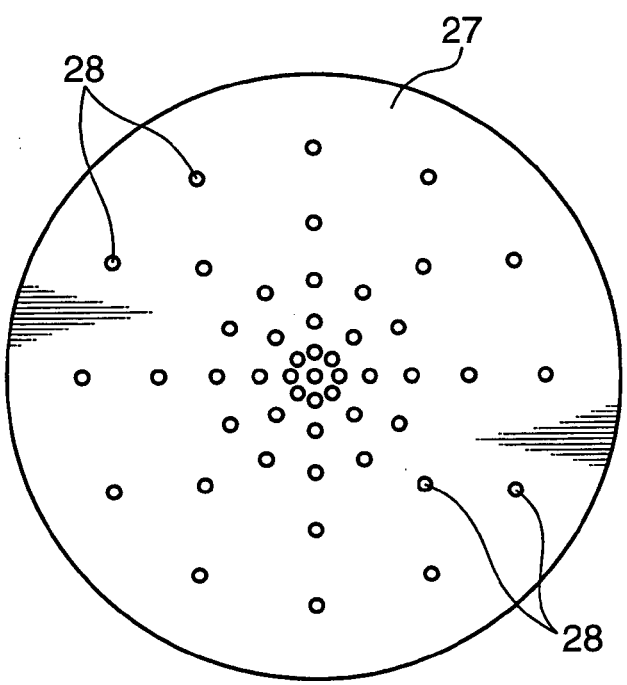
FIG. 4 is a top view of a fluid dispersion mechanism provided in a high pressure container of the high pressure processing apparatus shown in FIG. 3.

FIGS. 3 and 4 show a high pressure processing apparatus according to still another embodiment of the present invention.

In the illustrated high pressure processing apparatus, a plurality of through holes 28 formed in a closure plate 27 of a fluid dispersion mechanism 25 are formed concentrically with respect to the center of a wafer, and the respective diameters of the through holes 28 are arranged such that supercritical fluid passes through the through holes 28 at approximately the same flow rate. Further, the distance between the circumferentially adjacent through holes 28 is arranged such that it is reduced in the region of a closure plate 27 opposed to the central region or radially inward region of the wafer, more than in the region of the closure plate 27 opposed to the peripheral region or radially outward region of the wafer. Except for the above points, this embodiment has the same structure as that of the high pressure processing apparatus in FIG. 1.

According to the feature of the above high pressure processing apparatus, the supercritical carbon dioxide can be sprayed at approximately the same flow rate through the respective through holes 28, to allow the respective sprayed supercritical fluids to have approximately equalized flow rate on the surface 2a of the wafer 2.

In addition, the supercritical fluid can be approximately evenly distributed over the entire surface 2a of the wafer 2 while suppressing the consumption of the supercritical fluid. More specifically, the supercritical fluid supplied to the wafer 2 through the through holes 28 is distributed from the central region toward the peripheral region or radially outward region of the wafer 2, as shown in FIG. 3. Thus, if the distance between the adjacent through holes 28 in the circumferential direction of the closure plate 27 is constant, the supercritical fluid is excessively distributed in the peripheral region of the wafer 2. Consequently, the flow volume of the supercritical fluid is not equalized on the surface 2a of the wafer 2, and the supercritical fluid is needlessly consumed. By contrast, as shown in FIG. 4, according to the aforementioned feature of this embodiment in which the distance between the circumferentially adjacent through holes 28 is arranged such that it is reduced in the region of a closure plate 27 opposed to the central region or radially inward region of the wafer, more than in the region of the closure plate 27 opposed to the peripheral region of the wafer, the above problem of excessive distribution of the supercritical fluid in the peripheral region of the wafer can be prevented to distribute an adequate amount of supercritical fluid evenly over the entire surface of the wafer.

Thus, the high pressure processing apparatus according to this embodiment allows the supercritical fluid to be distributed at an even amount and flow rate on the surface 2a of the wafer 2 while suppressing needless consumption of the supercritical fluid.

Figure 5:
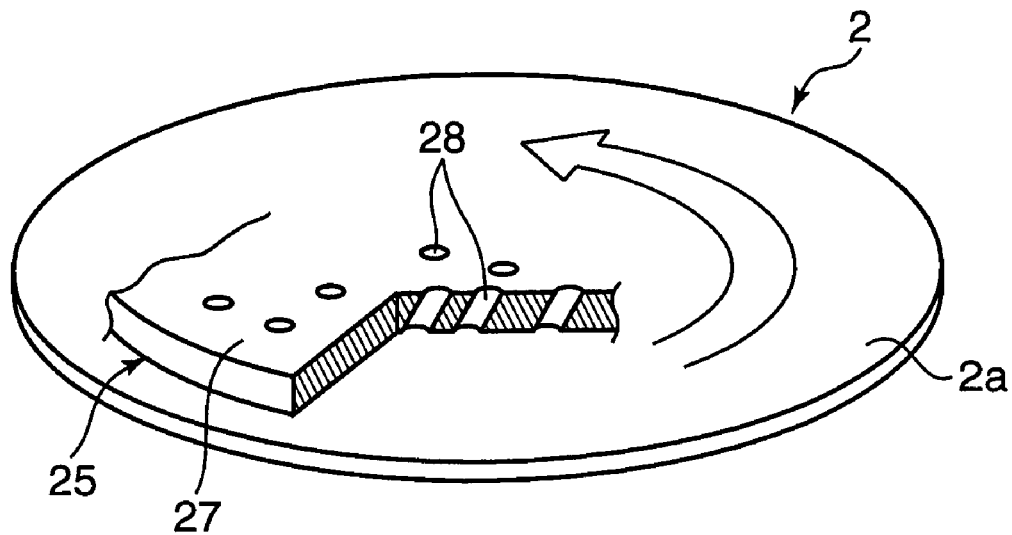
FIG. 5 is a fragmentary partial-sectional perspective view of a fluid dispersion mechanism in another embodiment of the present invention.
Figure 6:
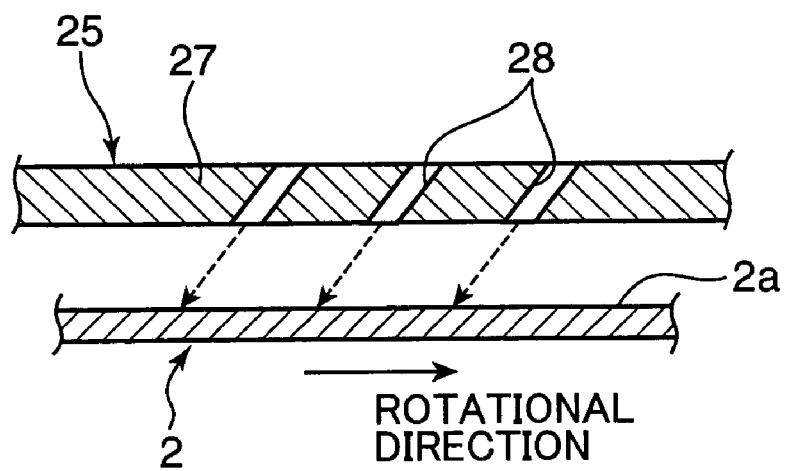
FIG. 6 is a sectional view of the fluid dispersion mechanism shown in FIG. 5.

FIGS. 5 and 6 show a high pressure processing apparatus according to yet another embodiment of the present invention.

In the illustrated high pressure processing apparatus, a plurality of through holes 28 formed in a closure plate 27 of a fluid dispersion mechanism 25 are formed such that they are inclined relative to the vertical direction or the direction of the rotational axis of a wafer 2, in a direction opposite to the rotation direction of the wafer 2, that is, the lower end opening of the through hole 28 is displaced relative to the upper end opening of the through hole 28, toward the upstream side of the rotation direction.

Except for the above points, this embodiment has the same structure as that of the high pressure processing apparatus in FIG. 1.

According to this high pressure processing apparatus, supercritical fluid can be supplied in a direction opposite to a direction of the rotational movement of the wafer 2, so as to generate turbulences in the supercritical fluid. Thus, dispersion of the supercritical fluid is well facilitated and the wafer can be more efficiently processed.

Figure 7:
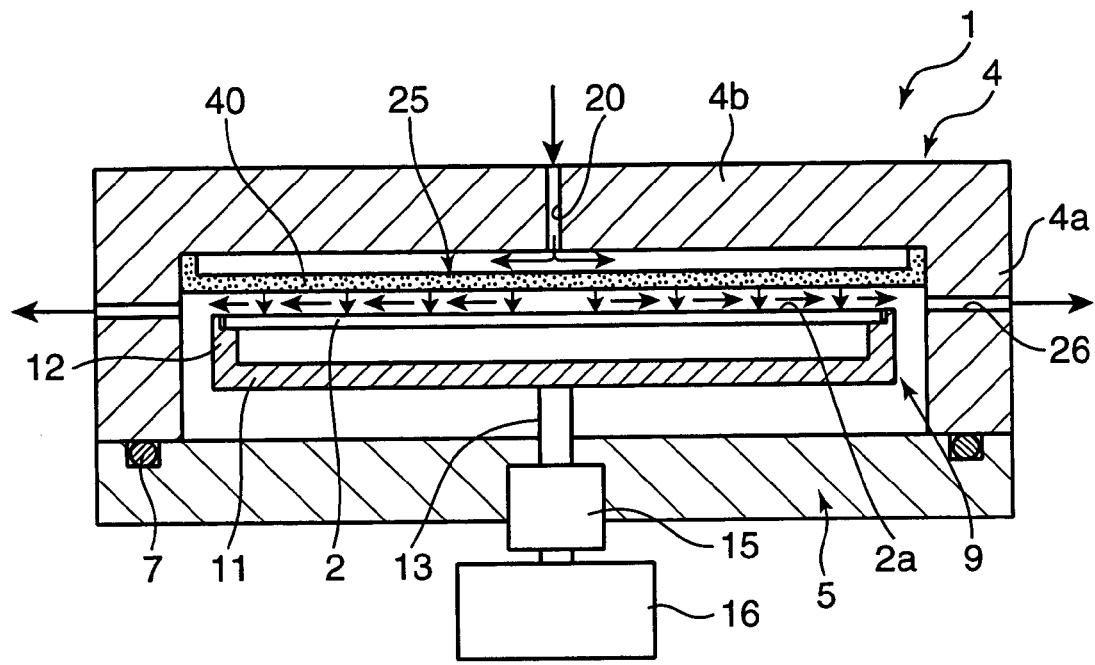
FIG. 7 is a sectional view of a high pressure processing apparatus according to another embodiment of the present invention.

As shown in FIG. 7, a plate-shaped member 40 made of porous material, such as sintered ceramics may be used as a substitute for the closure plate 27 having the aforementioned through holes 28. According to this feature, the supercritical fluid can pass through zigzag paths in the porous member. Thus, the dispersion of the supercritical fluid can be facilitated to supply the supercritical fluid evenly to the surface 2a of a wafer 2.

Figure 8:
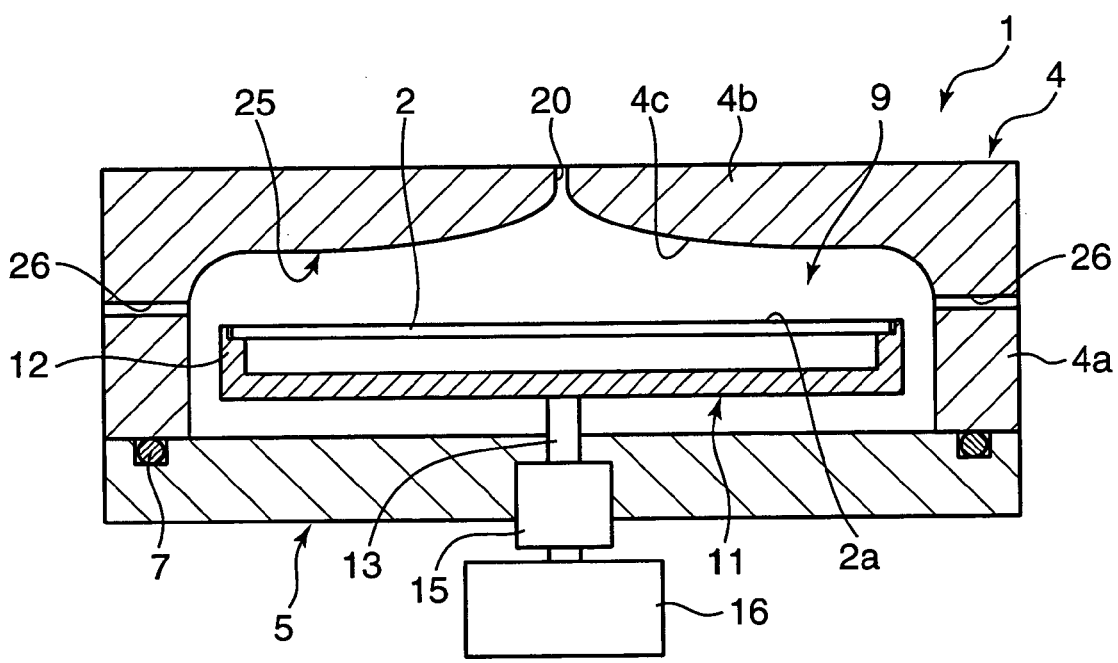
FIG. 8 is a sectional view of a high pressure processing apparatus according to another embodiment of the present invention.

FIG. 8 shows a high pressure processing apparatus according to yet still another embodiment of the present invention. In the illustrated high pressure processing apparatus, the inner surface 4c of the top wall 4b of a high pressure container 1 is formed in a trumpet-like shape or funnel-like shape to constitute the fluid dispersion mechanism 25. Specifically, the inner surface 4c is formed such that it gets closer to the surface 2a of a wafer 2 in a direction oriented outward from the center of the surface 2a of the wafer 2.

According to this feature, supercritical fluid introduced into a high pressure chamber 9 through a fluid introduction passage 20 is supplied while spreading over the entire region of the surface 2a of the wafer 2 by the fluid dispersion mechanism 25. After the collision with the surface 2a of the wafer 2, the supercritical fluid is distributed in the direction of the periphery of the wafer 2. Then, the supercritical fluid is further distributed outward from the periphery of the wafer 2, and discharged outside the high pressure processing chamber 9 through a fluid discharge passage 26. Thus, the supercritical fluid can be supplied evenly to the surface 2a of the wafer 2.

While the inner surface 4c of the top wall 4b of the high pressure container 1 may be simply formed in a trumpet-like shape or funnel-like shape allowing the supercritical fluid to be dispersed evenly over the entire region of the surface 2a of the wafer 2, the trumpet-shaped inner surface 4c of the top wall 4b of the high pressure container 1 may also be formed to include a hyperbolic surface to allow the flow rate of the supercritical fluid on the surface 2a to be adjusted at an even value.

Furthermore, the trumpet-shaped wall surface may be formed such that the distance from the center of the surface 2a of the wafer 2 along the surface 2a thereof is approximately in inverse proportion to the distance between the surface 2a and the inner surface 4c of the top wall 4b of the high pressure container 1. As with the aforementioned feature, this feature is advantageously act to equalize the flow rate of the supercritical fluid on the surface 2a of the wafer 2.

While the supercritical carbon dioxide or supercritical fluid is used as a high pressure fluid in the above embodiments, carbon dioxide in a subcritical state may be used as a substitute therefore. Further, the high pressure fluid to be used in the present invention is not limited to carbon dioxide, but any suitable fluid having a pressure of 1 MPa or more may be used as the high pressure fluid. The high pressure fluid in the present invention means a fluid of 1 MPa or more, in its essence. The high pressure fluid is preferably a fluid having recognizable properties of high density, high solubility, low viscosity and high diffusibility, more preferably the aforementioned fluid being in a supercritical or subcritical state. When carbon dioxide is used as the supercritical fluid, its critical temperature may be 31° C., and its critical pressure may be 7.1 MPa, preferably 7.4 MPa or more. Preferably, in a cleaning process, a rinse process after cleaning, or a drying/development process, subcritical (high pressure fluid) or supercritical fluid of 5 to 30 MPa is used, and such a processing is performed under 7.1 to 20 MPa, more preferably 7.4 to 20 MPa.

Also, the subcritical state is a state where one or both of the pressure and the temperature of a fluid are lower than the pressure and the temperature of a supercritical fluid, but near to the critical pressure and/or the critical temperature of the supercritical fluid. In the inventive method and apparatus, it may be appreciated to use a fluid which is in the subcritical state and in the liquid phase. Specifically, it may be appreciated to use a liquid carbon dioxide having a temperature of 10° C. or more but less than 31° C., and a pressure of 7.4 MPa or more, or a liquid carbon dioxide having a temperature of 10° C. or more but less than 31° C., and a pressure of 5.0 Mpa or more but less than 7.4 Mpa.

Further, it may be appreciated to use water, ammonia, nitrous oxide, ethanol, and the like other than carbon dioxide as high pressure fluid.

This application is based on patent application No. 2002-307349 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A high pressure processing apparatus for supplying a high pressure fluid to a processing object, the high pressure processing apparatus comprising:

a mounting table for supporting the processing object thereon;

a high pressure chamber adapted to contain the processing object therein, the high pressure chamber having a top wall positioned above an entire surface of the processing object on the mounting table and including a fluid introduction passage connected to a source of fluid at a high pressure of at least 1 MPa for introducing the high pressure fluid into the high pressure chamber, the high pressure chamber further having a side wall continuous with an outer peripheral part of the top wall and extending down therefrom to surround the mounting table;

a rotating mechanism adapted to rotate the processing object together with the mounting table;

a fluid dispersion mechanism for dispersing the flow of the high pressure fluid to be supplied toward the surface of the processing object from the fluid introduction passage; and a fluid discharger for allowing the high pressure fluid supplied from the fluid dispersion mechanism to the surface of the processing object, to be distributed radially outward along the surface of the processing object by the rotation of the processing object, and discharged outside the high pressure chamber, the fluid discharger including a fluid discharge passage provided in the sidewall of the high pressure chamber at an outward position relative to the processing object;

wherein the fluid dispersion mechanism includes a closure plate formed with a plurality of through holes and placed between the top wall and the mounting table in opposed relation to the entire surface of the processing object on the mounting table and the top wall, the closure plate being fitted to an internal surface of the side wall of the high pressure chamber so as to make a gap with the top wall and allow the high pressure fluid introduced through the introduction passage to be supplied perpendicular to the surface of the processing object through the gap and each of the through holes.

2. The high pressure processing apparatus as claimed in claim 1, wherein the fluid supplier is adapted to supply a supercritical or subcritical fluid as the high pressure fluid to the processing object.

3. The high pressure processing apparatus as claimed in claim 1, wherein the fluid discharge passage is approximately parallel to the surface of the processing object, to discharge the high pressure fluid outside the high pressure chamber.

4. The high pressure processing apparatus as claimed in claim 1, wherein the plurality of through holes are formed concentrically with respect to the center of the surface of the processing object, wherein the respective diameters of the through holes are arranged such that the high pressure fluid passes through the through holes at approximately the same flow rate, and the distance between the circumferentially adjacent through holes is arranged such that it is reduced in the region of the closure plate opposed to the radially inward region of the surface of the processing object, more than in the region of the closure plate opposed to the peripheral region of the surface of the processing object.

5. The high pressure processing apparatus as defined in claim 3, wherein the fluid discharge passage provided in the wall of the high pressure chamber at an outward position relative to the processing object and approximately parallel to the surface of the processing object is disposed in opposed relation to the peripheral edge of the processing object.

6. The high pressure processing apparatus as claimed in claim 1, wherein the fluid supplier is adapted to supply a supercritical fluid as the high pressure fluid to the processing object.

7. The high pressure processing apparatus as claimed in claim 1, wherein the high pressure chamber is substantially cylindrical.

* * * * *